United States Patent
Lu et al.

(10) Patent No.: US 11,955,586 B2
(45) Date of Patent: Apr. 9, 2024

(54) LIGHT-EMITTING DIODE LAMP HAVING HIGH COLOR-RENDERING PROPERTY AND COLOR-RENDERING PROPERTY ENHANCING METHOD THEREOF

(71) Applicant: Xiamen PVTECH Co., Ltd., Fujian (CN)

(72) Inventors: Fuxing Lu, Fujian (CN); Zhirong Lin, Fujian (CN)

(73) Assignee: Xiamen PVTECH Co., Ltd., Fujian (CN)

( * ) Notice: Subject to any disclaimer, the term of this patent is extended or adjusted under 35 U.S.C. 154(b) by 77 days.

(21) Appl. No.: 17/847,143

(22) Filed: Jun. 22, 2022

(65) Prior Publication Data
US 2023/0290910 A1 Sep. 14, 2023

(30) Foreign Application Priority Data
Mar. 14, 2022 (CN) .......................... 202210247621.4

(51) Int. Cl.
*F21K 9/64* (2016.01)
*F21Y 115/10* (2016.01)
*H01L 25/075* (2006.01)
*H01L 33/50* (2010.01)

(52) U.S. Cl.
CPC .............. *H01L 33/504* (2013.01); *F21K 9/64* (2016.08); *H01L 25/0753* (2013.01); *F21Y 2115/10* (2016.08)

(58) Field of Classification Search
CPC ....... F21Y 2113/10; F21Y 115/10; F21K 9/64
See application file for complete search history.

(56) References Cited

U.S. PATENT DOCUMENTS

2021/0038777 A1* 2/2021 Chen ...................... G06V 20/00

FOREIGN PATENT DOCUMENTS

CN 202484639 U * 10/2012 .............. F21S 8/035

* cited by examiner

*Primary Examiner* — William J Carter
(74) *Attorney, Agent, or Firm* — Winston Hsu

(57) ABSTRACT

A light-emitting diode (LED) lamp having high color-rendering property includes a lamp housing, a light source board, a plurality of white LEDs and a plurality of purple LEDs. The light source board is disposed in the lamp housing. The white LEDs are disposed on the light source board. The purple LEDs are disposed on the light source board. The wavelength range of the lights emitted by the purple LEDs is within the ultraviolet A (UVA) band.

6 Claims, 3 Drawing Sheets

LIGHT-EMITTING DIODE LAMP HAVING HIGH COLOR-RENDERING PROPERTY AND COLOR-RENDERING PROPERTY ENHANCING METHOD THEREOF

BACKGROUND OF THE INVENTION

1. Field of the Invention

The present invention relates to a light-emitting diode (LED) lamp, in particular to a LED lamp having high color-rendering property. The present invention further relates to a color-rendering property enhancing method for LED lamps.

2. Description of the Prior Art

As advance of technology, the functions of lamps keep being improved so as to meet the requirements of different applications. Color-rending property is an important indicator for evaluating the lighting quality of a lamp. Lamps having a high CRI (Color rendering index) are desirable in color-critical applications, such as the textile industry. However, most of current available lamps cannot satisfy the requirements of the above applications (even if the CRI of these lamps is more than 95).

SUMMARY OF THE INVENTION

One embodiment of the present invention provides a light-emitting diode (LED) lamp having high color-rendering property, which includes a lamp housing, a light source board, a plurality of white LEDs and a plurality of purple LEDs. The light source board is disposed in the lamp housing. The white LEDs are disposed on the light source board. The purple LEDs are disposed on the light source board. The wavelength range of the lights emitted by the purple LEDs is within the ultraviolet A (UVA) band.

In one embodiment, the wavelength ranges of the lights emitted by the purple LEDs are 320 nm~420 nm.

In one embodiment, the wavelength range of the lights emitted by the purple LEDs is 400 nm~420 nm.

In one embodiment, the quantity of the white LEDs is equal to that of the purple LEDs.

In one embodiment, the white LEDs and the purple LEDs are alternately arranged.

Another embodiment of the present invention provides a color-rendering property enhancing method for LED lamps, which includes the following steps: provided a light source board; disposing a plurality of white LEDs on the light source board; disposing a plurality of purple LEDs on the light source board, wherein the wavelength range of the lights emitted by the purple LEDs is within an UVA band; disposed the light source board in a lamp housing; and driving the white LEDs and the purple LEDs to evenly mix the lights emitted by the white LEDs with the lights emitted by the purple LEDs in order to generate a mixed light.

In one embodiment, the wavelength range of the lights emitted by the purple LEDs is 320 nm~420 nm.

In one embodiment, the wavelength range of the lights emitted by the purple LEDs is 400 nm~420 nm.

In one embodiment, the quantity of the white LEDs is equal to that of the purple LEDs.

In one embodiment, the method further includes the following step: alternately arranging the white LEDs and the purple LEDs.

The LED lamp having high color-rendering property and the color-rendering property enhancing method thereof in accordance with the embodiments of the present invention may have the following advantages:

(1) In one embodiment of the present invention, the LED lamp includes a plurality of white LEDs and a plurality of purple LEDs, and the white LEDs and the purple LEDs are alternately arranged. In this way, the light emitted by the LED lamp can overlap at least a part of the UVA band. Accordingly, the color-rendering property of the LED lamp can be significantly enhanced, so the light emitted by the LED lamp can more faithfully reveal the color of an object exposed under the light. Therefore, the lighting quality of the LED lamp can be effectively improved.

(2) In one embodiment of the present invention, the LED lamp includes a plurality of white LEDs and a plurality of purple LEDs, and the white LEDs and the purple LEDs are alternately arranged. In this way, the light emitted by the LED lamp can overlap at least a part of the UVA band. Accordingly, the color-rendering property of the LED lamp can be greatly enhanced with a view to meet the requirements of some color-critical applications, such as the textile industry.

(3) In one embodiment of the present invention, the LED lamp includes a plurality of white LEDs and a plurality of purple LEDs, and the wavelength range of the lights emitted by the purple LEDs is 400 nm~420 nm (410 nm±10 nm). The combination of the white LEDs and the purple LEDs can effectively enhance the color-rendering property of the LED lamp so as to further improve the lighting quality of the LED lamp.

(4) In one embodiment of the present invention, the design of the LED lamp can be applied to various types of lighting products, so this design is flexible in use and comprehensive in application.

(5) In one embodiment of the present invention, the color-rendering property of the LED lamp can be effectively enhanced by a simple structure design, so the desired technical effect can be achieved without significantly increasing the cost. Therefore, the LED lamp can have a high commercial value.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention and wherein.

DETAILED DESCRIPTION

Figure 1:
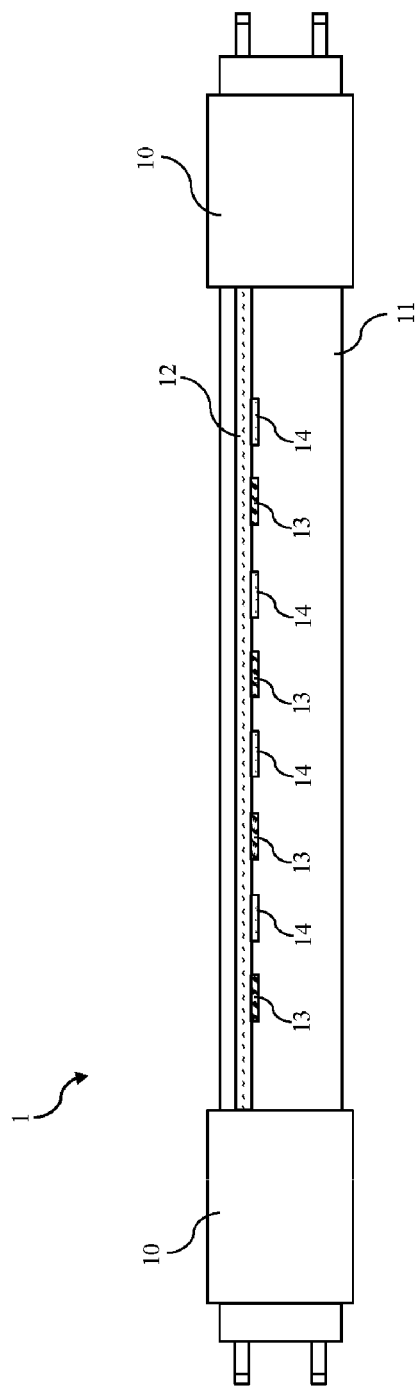
FIG. 1 is a schematic view of a LED lamp having high color-rendering property in accordance with one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Please refer to FIG. 1, which is a schematic view of a light-emitting diode (LED) lamp having high color-rendering property in accordance with one embodiment of the present invention. As shown in FIG. 1, the LED lamp 1 includes two lamp holders 10, a lamp housing 11, a light source board 12, four white LEDs 13 and four purple LEDs 14.

The light source board 11 is disposed in the lamp housing 11. In one embodiment, the lamp housing 11 may be made of a transparent material or a translucent material, such as plastics, glass or other similar materials.

The above white LEDs 13 is disposed on the light source board 12. The lights emitted by the above purple LEDs 14 are within the ultraviolet A (UVA) band. In this embodiment, the wavelength range of the lights emitted by the purple LEDs 14 is 410 nm. In another embodiment, the wavelength range of the lights emitted by the purple LEDs 14 is 320 nm~420 nm (within the UVA band). In still another embodiment, the wavelength range of the lights emitted by the purple LEDs 14 is 4000 nm~420 nm (within the UVA band). In this embodiment, the quantity of the white LEDs 13 is equal to that of the purple LEDs 14. In another embodiment, the quantity of the white LEDs 13 is different from that of the purple LEDs 14.

The two lamp holders 10 are disposed at two ends of the lamp housing 11. The two lamp holders 10 are connected to the white LEDs 13 and the purple LEDs 14 via the light source board 12, and further connected to a power source (not shown in the drawings). One of the lamp holders 10 may include a power supply unit and the electricity inputted by the power source can be outputted to the white LEDs 13 and the purple LEDs 14 via the power supply unit.

In addition, the white LEDs 13 and the purple LEDs 4 are alternately arranged. That is to say, any one of the white LEDs 13 is adjacent to at least one of the purple LEDs 14. Further, the white LEDs 13 and the purple LEDs 14 can be evenly distributed over the light source board 12.

When the white LEDs 13 and the purple LEDs 14 are driven by the power source, the lights emitted by the white LEDs 13 and the lights emitted by the purple LEDs 14 can be evenly mixed to generate a mixed light. As a result, the wavelength range of the light emitted by the LED lamp 1 can overlap at least a part of the UVA band. In this way, the color-rendering property of the LED lamp 1 can be dramatically enhanced, so the light emitted by the LED lamp 1 can more faithfully reveal the color of an object exposed under the light. Accordingly, the lighting quality of the LED lamp 1 can be effectively improved.

Moreover, as the white LEDs 13 and the purple LEDs 14 are alternately arranged, the light emitted by the LED lamp 1 can partially overlap the UVA band. Therefore, the color-rendering property of the LED lamp 1 can be significantly enhanced in order to meet the requirements of some color-critical applications, such as the textile industry.

In addition, the wavelength range of the lights emitted by the purple LEDs 14 is 400 nm~420 nm (in this embodiment, the wavelength of the lights emitted by the purple LEDs 14 is 410 nm). Thus, the combination of the white LEDs 13 and the purple LEDs 14 can effectively enhance the color-rendering property of the LED lamp 1 so as to greatly improve the lighting quality of the LED lamp 1.

The design of the LED lamp 1 of this embodiment can be applied to various types of lighting products. Therefore, the LED lamp 1 of this embodiment can satisfy the requirements of different applications.

The embodiment just exemplifies the present invention and is not intended to limit the scope of the present invention; any equivalent modification and variation according to the spirit of the present invention is to be also included within the scope of the following claims and their equivalents.

It is worthy to point out that most of current available lamps cannot satisfy the requirements of some color-critical applications, such as the textile industry (even if the CRI of these lamps is more than 95). On the contrary, according to one embodiment of the present invention, the LED lamp includes a plurality of white LEDs and a plurality of purple LEDs, and the white LEDs and the purple LEDs are alternately arranged. In this way, the light emitted by the LED lamp can overlap at least a part of the UVA band. Accordingly, the color-rendering property of the LED lamp can be significantly enhanced, so the light emitted by the LED lamp can more faithfully reveal the color of an object exposed under the light. Therefore, the lighting quality of the LED lamp can be effectively improved.

Besides, according to one embodiment of the present invention, the LED lamp includes a plurality of white LEDs and a plurality of purple LEDs, and the white LEDs and the purple LEDs are alternately arranged. In this way, the light emitted by the LED lamp can overlap at least a part of the UVA band. Accordingly, the color-rendering property of the LED lamp can be greatly enhanced with a view to meet the requirements of some color-critical applications, such as the textile industry.

Further, according to one embodiment of the present invention, the LED lamp includes a plurality of white LEDs and a plurality of purple LEDs, and the wavelength range of the lights emitted by the purple LEDs is 400 nm~420 nm (410 nm±10 nm). The combination of the white LEDs and the purple LEDs can effectively enhance the color-rendering property of the LED lamp so as to further improve the lighting quality of the LED lamp.

Moreover, according to one embodiment of the present invention, the design of the LED lamp can be applied to various types of lighting products, so this design is flexible in use and comprehensive in application. As described above, the LED lamp according to the embodiments of the present invention can definitely achieve great technical effects.

Figure 2:
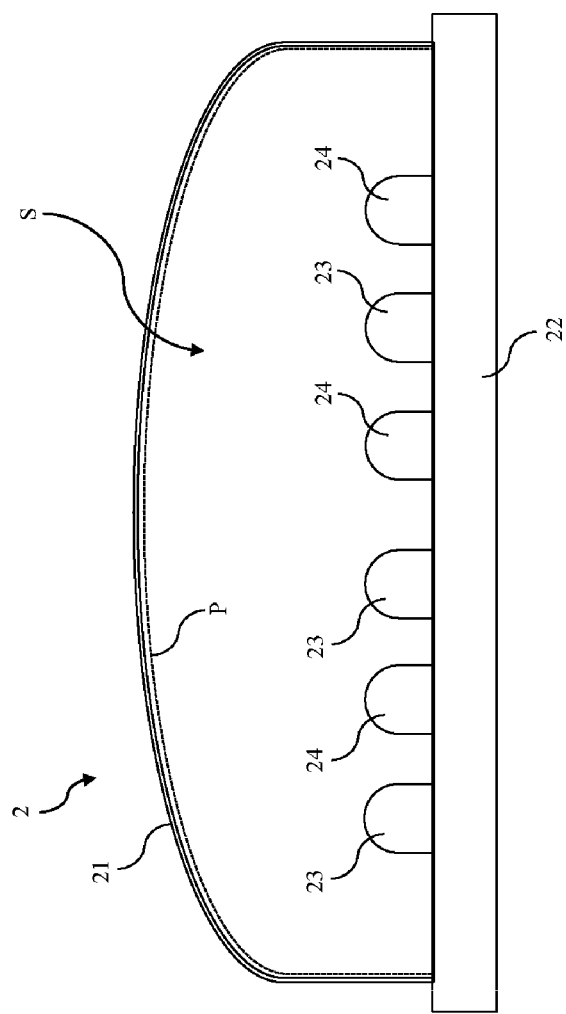
FIG. 2 is a schematic view of a LED lighting device having high color-rendering property in accordance with one embodiment of the present invention.

Please refer to FIG. 2, which is a schematic view of a LED lighting device having high color-rendering property in accordance with one embodiment of the present invention. As shown in FIG. 2, the LED lighting device 2 includes a transparent casing 21, a substrate 22, three white LED dies 23 and three purple LED dies 24.

The white LED dies 23 and the purple LED dies 24 are disposed on the substrate 22, and connected to a power source (not shown in the drawings). The transparent casing 21 is disposed on the substrate 22 so as to form an accommodating space S between the substrate 22 and the transparent casing 21. The white LED dies 23 and the purple LED dies 24 are disposed inside the accommodating space S. The inner surface of the transparent casing 21 is coated by a phosphor P (the phosphor P may be a yellow phosphor).

The wavelength range of the lights emitted by the purple LED dies 24 is 400 nm~420 nm (in this embodiment, the wavelength of the lights emitted by the purple LED dies 24 is 410 nm). Similarly, the white LED dies 23 and the purple LED dies 24 are alternately arranged.

As previously stated, in this embodiment, several white LED dies 23 and several purple LED dies 24 are packaged in one LED chip (lighting device), such that the lights emitted by the white LED dies 23 and the purple LED dies 24 can simultaneously stimulate the phosphor P coated on the inner surface of the transparent casing 21 to generate a white light. The white light generated by the above mechanism can partially overlap the UVA band. Thus, the color-rendering property of the white light can be significantly enhanced.

The embodiment just exemplifies the present invention and is not intended to limit the scope of the present invention; any equivalent modification and variation according to the spirit of the present invention is to be also included within the scope of the following claims and their equivalents.

Figure 3:
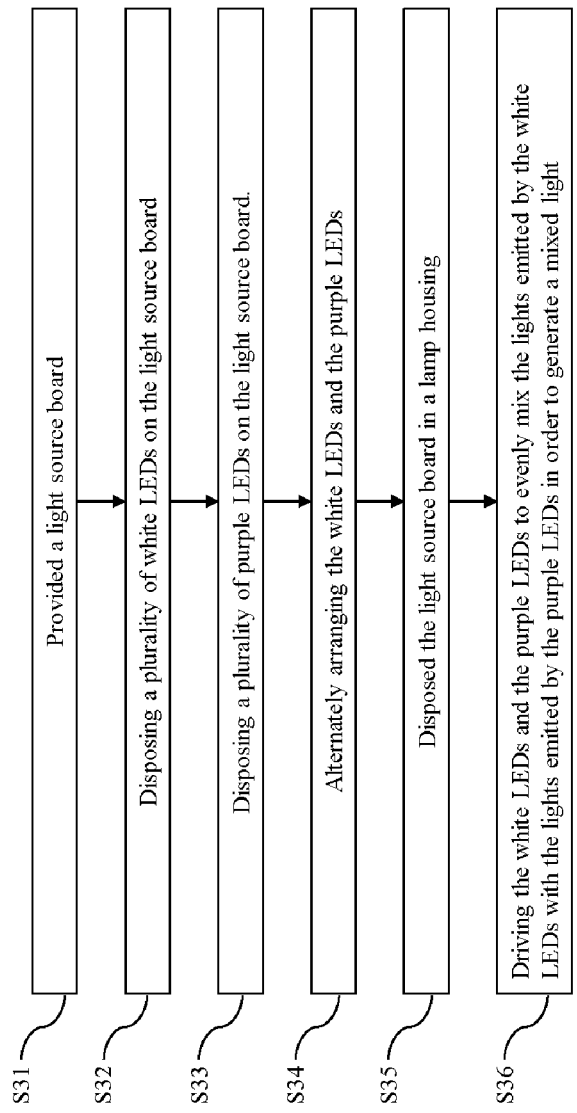
FIG. 3 is a flow chart of a color-rendering property enhancing method for LED lamps in accordance with one embodiment of the present invention.

Please refer to FIG. 3, which is a flow chart of a color-rendering property enhancing method for LED lamps in accordance with one embodiment of the present invention. As shown in FIG. 3, the color-rendering property enhancing method for LED lamps of this embodiment includes the following steps:

Step S31: provided a light source board.

Step S32: disposing a plurality of white LEDs on the light source board.

Step S33: disposing a plurality of purple LEDs on the light source board. As set forth above, the wavelength range of the lights emitted by the purple LEDs is within the UVA band.

Step S34: alternately arranging the white LEDs and the purple LEDs.

Step S35: disposed the light source board in a lamp housing.

Step S36: driving the white LEDs and the purple LEDs to evenly mix the lights emitted by the white LEDs with the lights emitted by the purple LEDs in order to generate a mixed light.

The embodiment just exemplifies the present invention and is not intended to limit the scope of the present invention; any equivalent modification and variation according to the spirit of the present invention is to be also included within the scope of the following claims and their equivalents.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

To sum up, according to one embodiment of the present invention, the LED lamp includes a plurality of white LEDs and a plurality of purple LEDs, and the white LEDs and the purple LEDs are alternately arranged. In this way, the light emitted by the LED lamp can overlap at least a part of the UVA band. Accordingly, the color-rendering property of the LED lamp can be significantly enhanced, so the light emitted by the LED lamp can more faithfully reveal the color of an object exposed under the light. Therefore, the lighting quality of the LED lamp can be effectively improved.

Also, according to one embodiment of the present invention, the LED lamp includes a plurality of white LEDs and a plurality of purple LEDs, and the white LEDs and the purple LEDs are alternately arranged. In this way, the light emitted by the LED lamp can overlap at least a part of the UVA band. Accordingly, the color-rendering property of the LED lamp can be greatly enhanced with a view to meet the requirements of some color-critical applications, such as the textile industry.

Further, according to one embodiment of the present invention, the LED lamp includes a plurality of white LEDs and a plurality of purple LEDs, and the wavelength range of the lights emitted by the purple LEDs is 400 nm~420 nm (410 nm±10 nm). The combination of the white LEDs and the purple LEDs can effectively enhance the color-rendering property of the LED lamp so as to further improve the lighting quality of the LED lamp.

Moreover, according to one embodiment of the present invention, the design of the LED lamp can be applied to various types of lighting products, so this design is flexible in use and comprehensive in application.

Furthermore, according to one embodiment of the present invention, the color-rendering property of the LED lamp can be effectively enhanced by a simple structure design, so the desired technical effect can be achieved without significantly increasing the cost. Therefore, the LED lamp can have a high commercial value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode (LED) lamp having high color-rendering property, comprising:
   a lamp housing;
   a light source board, disposed in the lamp housing;
   a plurality of white light-emitting diode (LED), disposed on the light source board; and
   a plurality of purple LEDs, disposed on the light source board, wherein wavelength range of lights emitted by the purple LEDs is within an ultraviolet A (UVA) band;
   wherein a quantity of the white LEDs is equal to a quantity of the purple LEDs, and the white LEDs 13 and the purple LEDs 14 are alternately arranged, wherein the light source board is provided with only the white LEDs and the purple LEDs without other LEDs having different colors.

2. The LED lamp having high color-rendering property as claimed in claim 1, wherein the wavelength range of the lights emitted by the purple LEDs is 320 nm~420 nm.

3. The LED lamp having high color-rendering property as claimed in claim 1, wherein the wavelength range of the lights emitted by the purple LEDs is 400 nm~420 nm.

4. A color-rendering property enhancing method for an LED lamp, comprising:
   providing a light source board;
   disposing a plurality of white LEDs on the light source board;
   disposing a plurality of purple LEDs on the light source board, wherein wavelength range of lights emitted by the purple LEDs is within a UVA band, wherein a quantity of the white LEDs is equal to a quantity of the purple LEDs, and the light source board is provided with only the white LEDs and the purple LEDs without other LEDs having different colors;

alternately arranging the white LEDs and the purple LEDs;

disposing the light source board in a lamp housing; and driving the white LEDs and the purple LEDs to evenly mix lights emitted by the white LEDs with the lights emitted by the purple LEDs in order to generate a mixed light.

5. The color-rendering property enhancing method for the LED lamp as claimed in claim 4, wherein the wavelength range of the lights emitted by the purple LEDs is 320 nm~420 nm.

6. The color-rendering property enhancing method for the LED lamp as claimed in claim 4, wherein the wavelength range of the lights emitted by the purple LEDs is 400 nm~420 nm.

* * * * *